(12) United States Patent
    Tabatowski-Bush

(10) Patent No.: US 10,749,194 B2
(45) Date of Patent: Aug. 18, 2020

(54) CIRCUIT AND METHOD FOR CELL VOLTAGE SENSING IN FUEL CELL STACK

(71) Applicant: FORD GLOBAL TECHNOLOGIES, LLC, Dearborn, MI (US)

(72) Inventor: Benjamin A. Tabatowski-Bush, South Lyon, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 947 days.

(21) Appl. No.: 15/352,236

(22) Filed: Nov. 15, 2016

(65) Prior Publication Data

US 2018/0138530 A1    May 17, 2018

(51) Int. Cl.
| | | |
|---|---|---|
| *G01N 27/416* | (2006.01) | |
| *H01M 8/04664* | (2016.01) | |
| *H01M 8/04537* | (2016.01) | |
| *G01R 31/00* | (2006.01) | |
| *G01R 31/371* | (2019.01) | |

(Continued)

(52) U.S. Cl.
CPC ....... *H01M 8/04671* (2013.01); *B60L 3/0053* (2013.01); *B60L 50/72* (2019.02); *G01R 31/007* (2013.01); *G01R 31/371* (2019.01); *G01R 31/396* (2019.01); *G01R 31/44* (2013.01); *H01M 8/04552* (2013.01); *B60L 2250/10* (2013.01); *H01M 8/04253* (2013.01); *H01M 8/04589* (2013.01); *H01M 2250/20* (2013.01); *Y02T 90/32* (2013.01)

(58) Field of Classification Search
CPC .. G01R 31/362; G01R 31/389; G01R 31/396; G01R 31/3835; G01R 31/3658; G01R 31/3689; G01R 31/2829; G01R 31/007; G01R 31/44; G01R 31/371; G01R 19/16538; G01R 19/16542; G01R 31/3606; G01R 31/3624; G01R 31/3679; G01R 31/3693; G01R 31/2605; G01R 31/405; G01R 31/40; G01R 31/42; G01R 31/08; G01R 31/024; G01R 31/025
See application file for complete search history.

(56) References Cited

U.S. PATENT DOCUMENTS 6,046,514 A * 4/2000 Rouillard ................ H01M 2/34
                                                   200/210
8,030,941 B2    10/2011 Coenen
(Continued)

FOREIGN PATENT DOCUMENTS

CN         101860053         10/2010

OTHER PUBLICATIONS

Cellsense FC On-site Cell Voltage Monitoring for FC Management and Lifetime Evaluation, Vito NV, May 7, 2009, Belgium.
(Continued)

*Primary Examiner* — Thang X Le
(74) *Attorney, Agent, or Firm* — Brooks Kushman PC; David Kelley

(57) ABSTRACT

A vehicle system includes a voltage sensing circuit configured to detect voltages across cells in a fuel cell stack, and powered by a power supply sharing a voltage reference with the cells and having a voltage magnitude greater than a sum of voltage magnitudes of the cells. The system further includes a controller configured to, responsive to a change in polarity in at least one of the voltages indicative of freezing of the cells, issue an alert notification.

11 Claims, 5 Drawing Sheets

(51) Int. Cl.
    *G01R 31/396*     (2019.01)
    *G01R 31/44*     (2020.01)
    *B60L 3/00*     (2019.01)
    *B60L 50/72*     (2019.01)
    *H01M 8/04223*     (2016.01)

(56) References Cited

U.S. PATENT DOCUMENTS

| | | | |
|---|---|---|---|
| 8,519,717 B2 | 8/2013 | Jung et al. | |
| 8,974,976 B2 | 3/2015 | Skala | |
| 2001/0011881 A1* | 8/2001 | Emori | G01R 19/16542 320/116 |
| 2011/0260770 A1* | 10/2011 | Sekiguchi | G01R 31/3835 327/333 |
| 2012/0206105 A1* | 8/2012 | Nishizawa | H01M 10/441 320/134 |
| 2016/0089999 A1 | 3/2016 | Tabatowski-Bush et al. | |

OTHER PUBLICATIONS

Lithium Ion Battery Monitoring System—AD7280A, Analog Devices, Apr. 2011, Norwood, MA, USA.

\* cited by examiner

CIRCUIT AND METHOD FOR CELL VOLTAGE SENSING IN FUEL CELL STACK

TECHNICAL FIELD

The present disclosure relates to systems and methods for cell voltage sensing in a fuel cell stack.

BACKGROUND

A fuel cell is an electrochemical conversion device that produces electricity from a fuel and oxidant that react in the presence of an electrolyte. A single fuel cell may include a membrane electrode assembly and two flow field plates. Single cells may be combined into a fuel cell stack to produce the desired level of electrical power. A fuel cell may include two electrodes, an anode and cathode, separated by a polymer membrane electrolyte. Each of the electrodes may be coated on one side with a thin platinum catalyst layer. The electrodes, catalyst and membrane together form the membrane electrode assembly.

Gases, e.g., hydrogen and air, may be supplied to the electrodes on either side of the membrane through channels formed in the flow field plates. Hydrogen flows through the channels to the anode where the platinum catalyst promotes its separation into protons and electrons. On the opposite side of the membrane, air flows through the channels to the cathode where oxygen in the air reacts with the hydrogen protons which pass through the membrane. The hydrogen dissociates into free electrons and protons (positive hydrogen ions) in the presence of the platinum catalyst at the anode. The free electrons are conducted in the form of usable electric current through an external circuit. The protons migrate through the membrane electrolyte to the cathode. At the cathode, oxygen from the air, electrons from the external circuit and protons combine to form water and heat.

SUMMARY

A vehicle system includes a voltage sensing circuit configured to detect voltages across cells in a fuel cell stack, and powered by a power supply sharing a voltage reference with the cells and having a voltage magnitude greater than a sum of voltage magnitudes of the cells, and a controller configured to, responsive to a change in polarity in at least one of the voltages indicative of freezing of the cells, issue an alert notification.

A method for a vehicle includes issuing an alert notification, by a controller, responsive to a change in polarity in at least one voltage detected by a voltage sensing circuit across cells in a fuel cell stack that is indicative of freezing of the cells, the sensing circuit being powered by a power supply sharing a voltage reference with the cells and having a voltage magnitude greater than a sum of voltage magnitudes of the cells.

A system for a vehicle includes a split rail power supply sharing a voltage reference with cells of a fuel cell stack and having an operating voltage range that is greater than a sum of voltage magnitudes of the cells. The power supply is configured to power a voltage sensing circuit having a plurality of inputs connected across the cells and configured to detect magnitude and polarity of cell voltages. The system also includes a controller configured to issue an alert notification responsive to a change in polarity in at least one of the voltages indicative of freezing of the cells.

DETAILED DESCRIPTION

Embodiments of the present disclosure are described herein. It is to be understood, however, that the disclosed embodiments are merely examples and other embodiments may take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the present invention. As those of ordinary skill in the art will understand, various features illustrated and described with reference to any one of the figures may be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

A plurality of cells defining a traction battery of a fuel cell vehicle may behave differently from those defining a lithium-ion battery. Specifically, water or other material present in a fuel cell may freeze under low ambient temperatures thereby causing the cell voltage to change polarity, e.g., cell voltage reversal, and may in some cases cause a voltage measuring circuit to read an incorrect value or cause the circuit to fail altogether.

For example, a circuit for measuring voltage across a given fuel cell may define integrated circuits (ICs) formed on a semiconductor material and may thereby include one or more substrate diodes, electrical components either intentionally formed as part of an IC design and fabrication process or expressed as a parasitic behavior of a different circuit component exposed to operating conditions outside a typical range. As does a regular diode, a substrate diode includes a positive terminal (anode) and a negative terminal (cathode) permitting current flow when voltage at the anode is greater than voltage at the cathode and blocking current flow when voltage at the anode is less than voltage at the cathode. Depending on a presence of a substrate diode in one or more inputs to the voltage measuring circuit, voltage polarity reversal in a fuel cell may cause the diode to conduct and permit an unintentional current flow.

Figure 1:
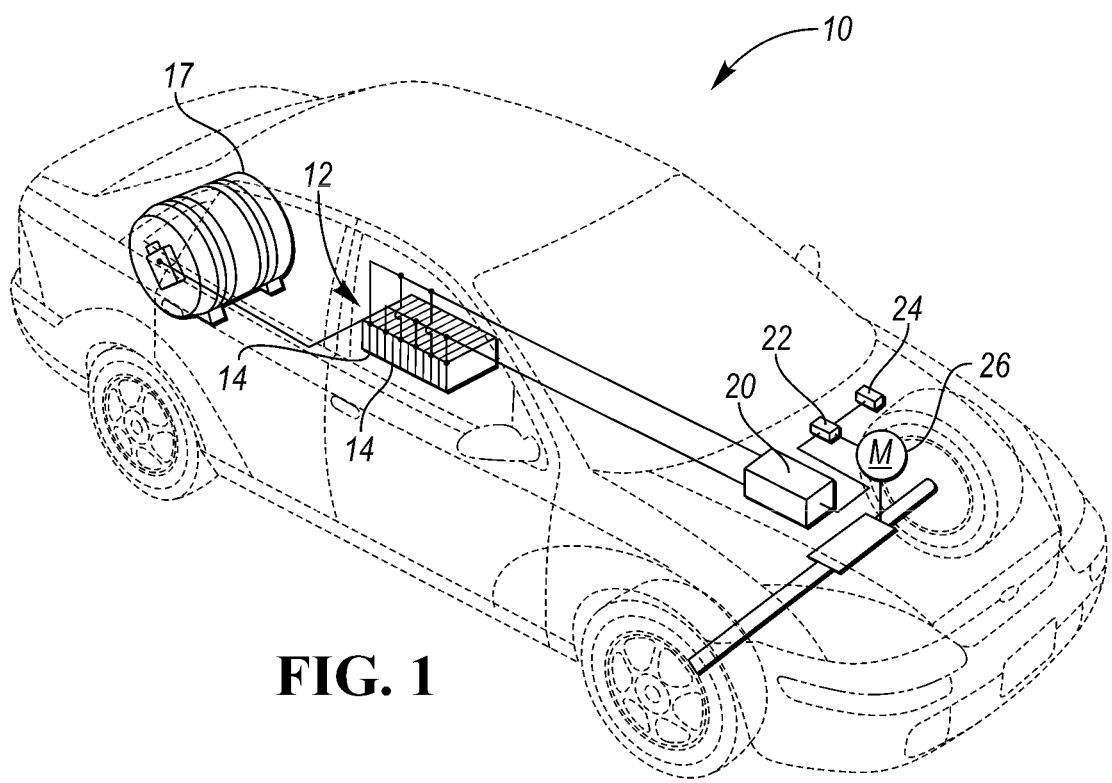
FIG. 1 is a block diagram illustrating a drivetrain and energy storage components for a fuel cell vehicle having cell voltage sensing.

In reference to FIG. 1, a vehicle 10 is illustrated with a fuel cell stack 12 for powering the vehicle 10. The vehicle 10 may be of various types of passenger vehicles, such as crossover utility vehicle (CUV), sport utility vehicle (SUV), truck, recreational vehicle (RV), boat, plane or other mobile machine for transporting people or goods. The fuel cell stack 12 may include one or more individual cells 14, such as proton exchange membrane fuel cells, each cell defining a positive electrode (an anode), a negative electrode (a cathode), and a membrane therebetween. In one example, each of the anodes and the cathodes may include a gas diffusion layer, a catalyst layer, and a bipolar or flow field plate forming a plurality of gas channels, where the anode catalyst layer facilitates splitting of hydrogen atoms into hydrogen ions and electrons and the cathode catalyst layer facilitates the reaction of oxygen gas, hydrogen ions, and electrons to form water. The anode and cathode of a given cell 14 may each further include a microporous layer disposed between the diffusion and the catalyst layers. Each cell 14 may provide a same or different nominal threshold of voltage and under some conditions, such as when water in the fuel cell 14 freezes, voltage value across the cell 14 may change polarity, i.e., cell voltage reversal. The cells 14 may be arranged in series, in parallel, a combination of series and parallel, or another connection configuration with each other and may be further arranged into one or more groups, arrays, sections, or modules further connected in series, in parallel, a combination of series and parallel connections, and so on.

The fuel cell stack 12 may be disposed in a traction battery pack (or traction battery) 16 and may be powered by an on-board fuel source 17. The fuel source 17 may be a storage tank filled with a substance comprising a chemical element, a chemical compound or the like, such that an interaction between the substance and the one or more portions of the cells 14 of the fuel cell stack 12, e.g., electrolysis, causes a chemical reaction generating an electrical or electromotive force. In one example, the fuel source 17 may include a hydrogen element, a hydrogen compound, or one or more other gaseous, liquid, or solid substances stored under pressure. The fuel source 17 comprising fuel including other elements and compounds, such as, for example, oxygen-, hydrogen-, or nitrogen-derived compounds, is also contemplated. The fuel source 17 may supply the fuel to the cells 14 of the fuel cell stack 12 such that a chemical reaction with oxygen in the air, e.g., such as air supplied by an air compressor (not shown), may power the vehicle 10.

The traction battery 16 may further include a battery controller 18 having a processor and a memory and configured to monitor and control energy flow to and from the fuel cell stack 12. The battery controller 18 may be configured to monitor one or more operating parameters of the one or more cells 14 of the fuel cell stack 12, such as, but not limited to, current, voltage, and temperature, and so on. The battery controller 18 may, in one example, be configured to monitor voltage magnitude and voltage polarity of the cells 14. As will be described in further detail in reference to FIG. 2, responsive to voltage across the cells 14 exceeding a predefined magnitude and/or having a positive polarity, the battery controller 18 may issue a command to close one or more switches 30 to allow energy flow to and from the fuel cell stack 12. The battery controller 18 may be further configured to issue an alert notification responsive to voltage across the cells 14 being less than a predefined magnitude and/or having a negative polarity.

The traction battery 16 may be electrically connected to and in communication with a high voltage bus 20. In one example, the battery controller 18 in communication with the high voltage bus 20 may be configured to control energy flow between the fuel cell stack 12 and the high voltage bus 20, responsive to a request from the high voltage bus 20, responsive to sensor parameter values exceeding or being below predefined values, or responsive to another signal or request.

The high voltage bus 20 may be an electrical bus configured to receive and route or otherwise distribute electrical energy to and from one or more subsystems of the vehicle 10, such as, but not limited to, propulsion, climate control, infotainment, steering, braking, and so on. In one example, the high voltage bus 20 may communicate with and provide energy to a power controller 22 configured to condition power transferred to and from one or more low voltage loads 24, e.g., an auxiliary battery, and so on, and one or more high voltage loads 26, e.g., a traction motor, and so on. In one example, the power controller 22 may convert high DC voltage output by the high voltage bus 20 to low voltage compatible with the low voltage loads 24 and invert high DC voltage output by the high voltage bus 20 to AC to power the traction motor connected to one or more wheels propelling the vehicle 10. In another example, the flow of energy through the power controller 22 may be bi-directional, such that the power controller 22 may convert AC energy generated by the traction motor during a regenerative braking event to DC for storage in one or more auxiliary batteries.

Figure 2:
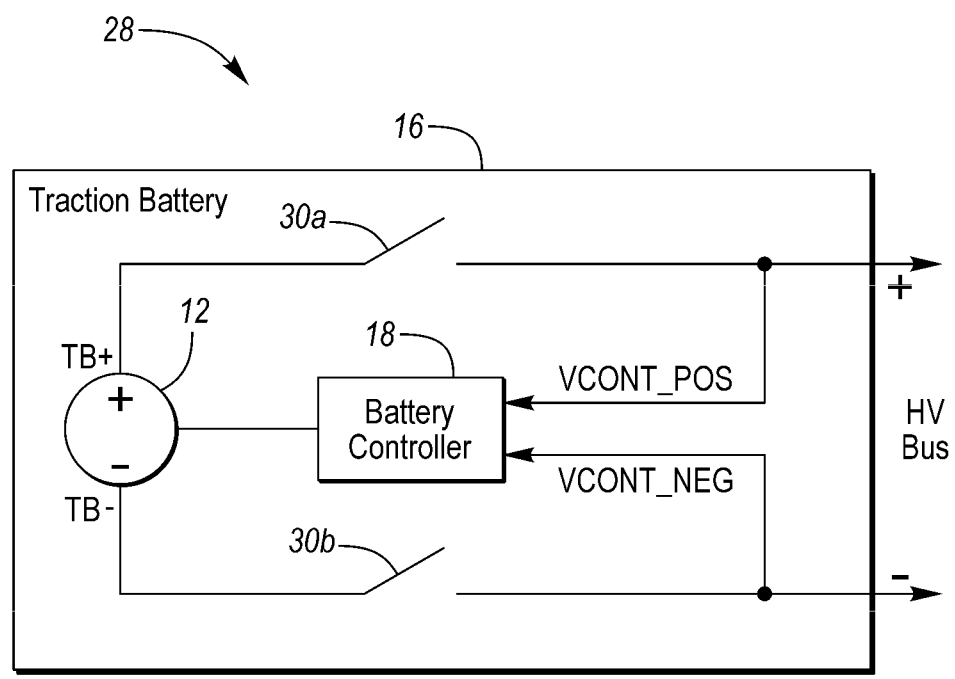
FIG. 2 is a block diagram illustrating a fuel cell battery including cell voltage sensing.

In reference to FIG. 2, an example arrangement 28 of the traction battery 16 for the vehicle 10 is illustrated. The fuel cell stack 12 may be connected to the high voltage bus 20 via the positive and negative electrodes of the cells 14 interconnected to define positive and negative terminals of the fuel cell stack 12. The battery controller 18 may monitor one or more operating parameters of the fuel cell stack 12 and may control energy flow to and from the fuel cell stack 12. In one example, the battery controller 18 may be configured to selectively open and close one or more switches 30 connecting and disconnecting the fuel cell stack 12 to and from the high voltage bus 20 via the respective positive and negative terminals. The switches 30 may be contactors, relays, or other switching devices configured to enable energy flow between the fuel cell stack 12 and the high voltage bus 20 when closed and disable energy flow when open. The battery controller 18 may selectively command the switches 30 to open or close based on magnitude and/or polarity of one or more operating parameters of the fuel cell stack 12.

As will be described in further detail in reference to FIG. 3, one or more components of the battery controller 18 may define ICs formed on a semiconductor material, such as, but not limited to, compounds derived from silicon, germanium, gallium, and so on. In one example, one or more components of the battery controller 18 may be a semiconductor device packaged as one or more of a through-hole, surface mount, chip carrier, pin grid array, flat, small outline, chip-scale, and ball grid array package types developed using one or more of wafer bonding, IC bonding techniques, such as wire, thermosonic, down, tape-automated, and tab bonding, and IC encapsulation methodologies, such as baking, plating, lasermarking, trim-and-form, and so on. A given bonding process for forming one or more components of the battery controller 18 may meet a variety of environmental conditions, such as, but not limited to, substrate surface flatness, smoothness, and cleanliness, temperature and ambient pressure of a bonding environment, magnitude of an applied force of the bond, and so on.

The one or more ICs of the battery controller 18 may define substrate diodes, wherein a portion of the battery controller 18 may operate or cause another portion the battery controller 18 to operate in an unintended mode of operation in response to one or more conditions being met.

Specifically, an NPN bipolar junction transistor may resemble two PN-junction diodes connected together by a common anode and may form a parasitic diode structure causing current to flow from a transistor base to collector in response to a forward bias applied to the transistor exceeding a predefined threshold. Additionally or alternatively, a substrate diode of the battery controller 18 may be an integrated diode structure fabricated in the integrated circuit as part of one or more processing techniques. The substrate diode may, for instance, be a PN-junction fabricated from a single counterdoped region in the substrate.

Figure 3:
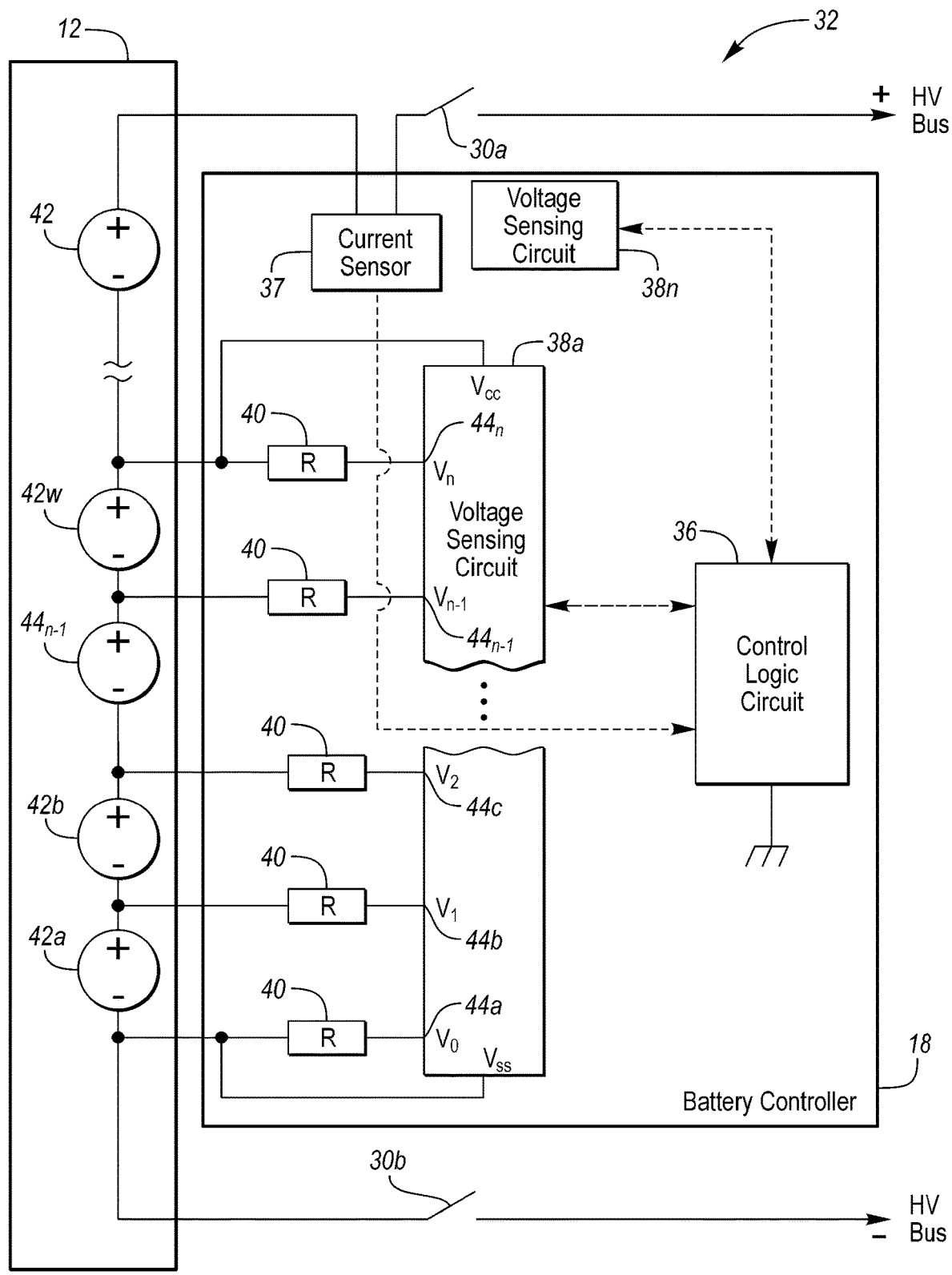
FIG. 3 is a block diagram illustrating a fuel cell battery controller including a voltage monitoring circuit.

FIG. 3 illustrates an example arrangement 32 for the battery controller 18 of the traction battery 16. The cells 14 may be arranged in series with one another and grouped into a plurality of cell groups 42 also in series with one another, each group 42 having positive and negative terminals. Each cell 14 may provide a same or different nominal threshold of voltage and under some conditions, such as when water in the cell 14 freezes, voltage value across the cell 14 may change polarity, i.e., exhibit cell voltage reversal. A control logic circuit 36 may be configured to monitor one or more operating parameters of the cell groups 42 using a fuel cell voltage monitoring circuit (hereinafter, voltage monitoring circuit) 38. In one example, the control logic circuit 36 of the battery controller 18 may include a processor (not shown) and memory (not shown) such that instructions stored in the memory and processed by the processor enable the control logic circuit 36 to perform functions described herein. Specifically, the control logic circuit 36 may be in communication with the voltage monitoring circuit 38 and may be configured to issue an alert notification in response to voltage across one or more cells 14 or cell groups 42 being below a predefined magnitude and/or having a negative polarity.

The voltage monitoring circuit 38 may comprise a plurality of voltage sensing inputs 44 connected across the cell groups 42 via a plurality of current limiting resistors 40 sized to limit an effect of a voltage spike on the voltage sensing inputs 44. The control logic circuit 36 may be configured to command the voltage monitoring circuit 38 to determine voltage across one or more cell groups 42. The voltage monitoring circuit 38 may include a multiplexer (not shown) or another analog or digital computing device, such as an analog-to-digital (A/D) converter, configured to compute voltage across a given cell group 42 using voltage values received at the voltage sensing inputs 44 of the cell group 42. In one example, the voltage monitoring circuit 38 may determine voltage across the cell group 42a based on voltage measured between a voltage sensing input $V_1$ 44b and a voltage sensing input $V_0$ 44a. In another example, the voltage monitoring circuit 38 may determine voltage across the cell group 42b based on a voltage measured between a voltage sensing input $V_2$ 44c and the voltage sensing input $V_0$ 44a minus the voltage measured across the cell group 42a and so on. Thus, the voltage monitoring circuit 38 having, for example, an N+1 number of voltage sensing inputs 44 may provide voltage measurements for an N number of cell groups 42 of the fuel cell stack 12. Additionally or alternatively, the control logic circuit 36 may be configured to compare the voltage value measured across a given cell group 42 to a predefined voltage threshold and may issue an alert notification in response to determining that the value exceeds or is below a predefined voltage threshold.

The voltage monitoring circuit 38 may be powered by one or more of the cells 14, the cell groups 42, and so on, of the fuel cell stack 12. In one example, the voltage monitoring circuit 38 may receive power via a positive supply voltage pin $V_{CC}$ 46 and a negative supply voltage pin $V_{SS}$ 48 connected with top-most and bottom-most cells 14, respectively, of the cells 14 being measured. For example only, for the cell groups 42a to 42n connected in series with each other, the negative supply voltage pin $V_{SS}$ 48 may be connected to the negative terminal of the bottom cell group 42, e.g., the negative terminal of the cell group 42a, and the positive supply voltage pin $V_{CC}$ 46 may be connected to the positive terminal of the top cell group 42, e.g., the positive terminal of the cell group 42n. In such an arrangement, the voltage monitoring circuit 38 may be biased to operate according to voltage magnitudes produced by the cells 14 of the cell groups 42a to 42n. In one example, the voltage monitoring circuit 38 configured to measure voltage of twelve (12) cell groups 42, wherein each cell group 42 includes four (4) cells 14 and each cell 14 is configured to produce voltages between +1.1 volts (V) and 0 V, may have operating voltage between +52.8 V and 0 V.

Figure 4:
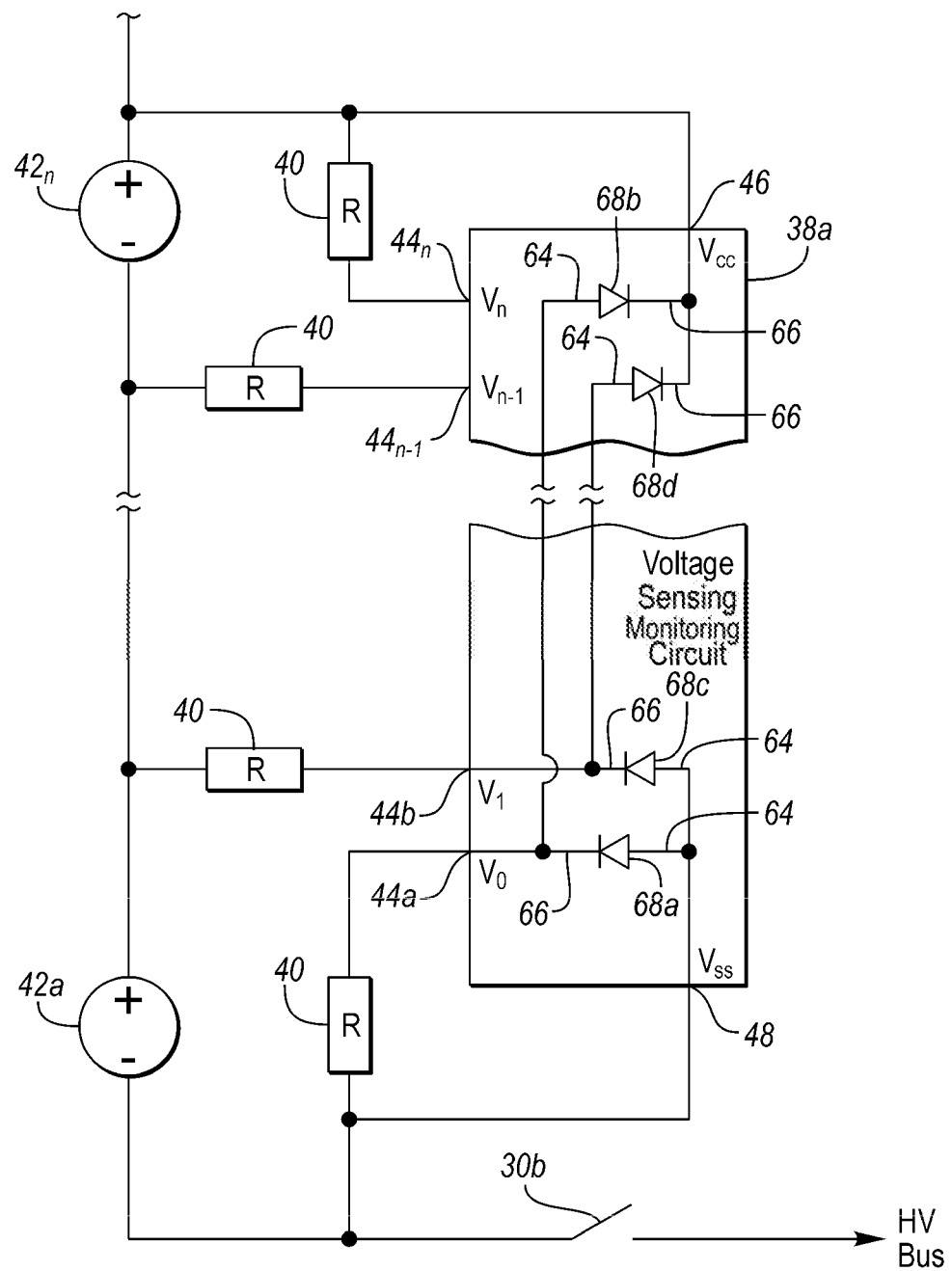
FIG. 4 is a block diagram illustrating substrate diodes of the voltage monitoring circuit.

In one example, one or more voltage sensing inputs 44 and the positive and negative supply voltage pins $V_{CC}$ 46 and $V_{SS}$ 48, respectively, define substrate diodes. As illustrated in FIG. 4, substrate diodes 68a and 68c each include a positive terminal (anode) 64 connected to the negative supply voltage pin $V_{SS}$ 48 and a negative terminal (cathode) 66 connected to the voltage sensing inputs $V_0$ 44a and $V_1$ 44b, respectively. The substrate diodes 68b and 68d each include a cathode 66 connected to the positive supply voltage pin $V_{CC}$ 46 and an anode 64 connected to the voltage sensing inputs $V_0$ 44a and $V_1$ 44b, respectively. While FIG. 4 illustrates substrate diodes 68a-68d between voltage sensing inputs $V_0$ 44a and $V_1$ 44b and the positive and negative supply voltage pins $V_{CC}$ 46 and $V_{SS}$ 48, other voltage sensing inputs 44 of the voltage monitoring circuit 38a, as well as the voltage sensing inputs 44 of other voltage monitoring circuits 38, may also include one or more substrate diodes 68 connected to the positive and negative supply voltage pins $V_{CC}$ 46 and $V_{SS}$ 48. As an example, voltage sensing inputs $V_N$ 44n and $V_{N-1}$44n-1 may define substrate diodes 68 connected with the positive and negative supply voltage pins $V_{CC}$ 46 and $V_{SS}$ 48, respectively.

The substrate diodes 68 may conduct current, e.g., a forward biased state, in response to magnitude of voltage at the anode 64 exceeding magnitude of voltage at the cathode 66. The substrate diodes 68 may prevent current flow, e.g., a reverse biased state, in response to magnitude of voltage at the cathode 66 exceeding magnitude of voltage at the anode 64. In some examples, each of the substrate diodes 68 may define a nominal voltage drop, e.g., 0.6V, and may be forward or reverse biased in response to voltage difference between the anode 64 and the cathode 66 being equal to or greater than the magnitude of the voltage drop.

In some instances behavior of the substrate diodes 68 may be parasitic. The substrate diodes 68a-68d may, for example, allow an undesirable current flow into one or more of the positive and negative voltage supply pins $V_{CC}$ 46 and $V_{SS}$ 48, respectively, voltage sensing inputs 44, and so on. The substrate diode 68d may, for example, conduct current, in response to voltage at the voltage sensing input $V_1$ 44a exceeding voltage at the positive voltage supply pin $V_{CC}$ 46, such as when water or other material in one or more cell groups 42 freezes and one or more cell groups 42 exhibit cell voltage polarity reversal. As will be described in further detail in reference to FIG. 5, the battery controller 18 may be configured to prevent the substrate diodes 68 from conducting current, e.g., prevent the substrate diodes 68 from becoming forward biased, under one or more operating conditions of the fuel cell stack 12. Additionally or alternatively, magnitude of current flowing through the substrate diodes 68 that are in a reverse biased state may exceed a predefined threshold responsive to cell voltage polarity reversal. The battery controller 18 may be further configured such that magnitude of current flowing through the substrate diodes 68 is less than a predefined threshold under one or more operating conditions of the fuel cell stack 12.

The control logic circuit 36 may be configured to issue or more commands to close and open the switches 30, thereby connecting and disconnecting the fuel cell stack 12 from the high voltage bus 20 and, thus, enabling and disabling a flow of current between the high voltage bus 20 and the fuel cell stack 12, respectively. In one example, the control logic circuit 36 may be in communication with other controllers (not shown) of the vehicle 10, such as, but not limited to, a propulsion controller, a steering controller, a heating ventilation and air conditioning controller, and so on, and may be configured to issue one or more commands opening and/or closing the switches 30 in response to one or more signals from the other controllers indicative of a request to enable or disable energy flow to or from the fuel cell stack 12. In another example, the control logic circuit 36 may be configured to receive input from a current sensor 37 monitoring a magnitude of current of the cells 14 and/or the cell groups 42 of the fuel cell stack 12. The control logic circuit 36 may issue one or more commands opening and/or closing the switches 30 in response to the magnitude of current received from the current sensor 37 being greater than a predefined value.

Figure 5:
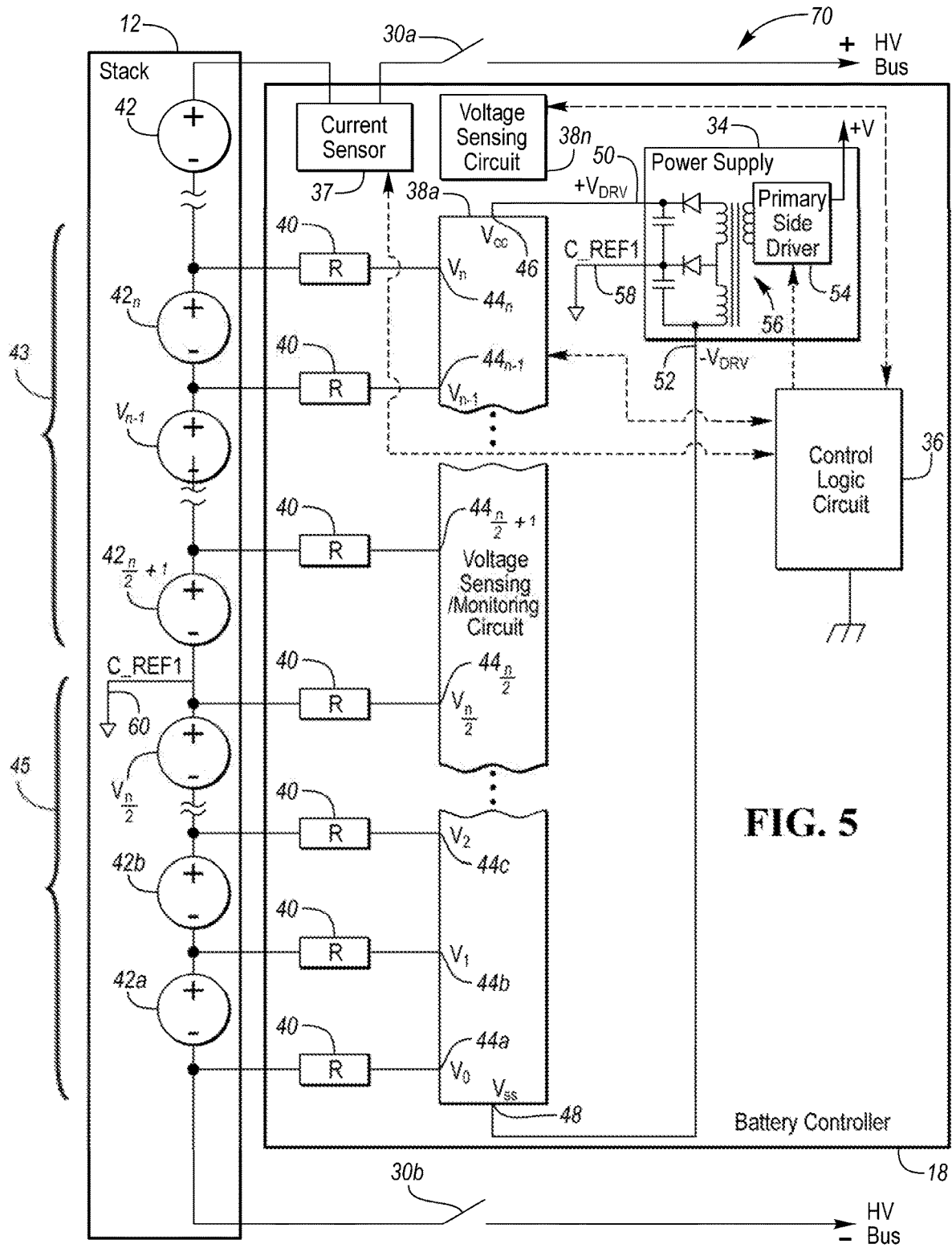
FIG. 5 is a block diagram illustrating a voltage monitoring circuit for cell voltage polarity reversal.

FIG. 5 illustrates an example arrangement 70 for the battery controller 18 configured to provide cell voltage sensing during cell voltage polarity reversal. Each of the voltage monitoring circuits 38 may include a plurality of voltage sensing inputs 44 and may be configured to monitor voltages across a plurality of the cell groups 42. The plurality of cell groups 42 may be further grouped and arranged with respect to a voltage reference point 60. Specifically, an upper cell group string (hereinafter, upper cell string) 43 may include one-half of the plurality of the cell groups 42 being monitored by a given voltage monitoring circuit 38 and may have voltage potential above the reference point 60. Additionally or alternatively, a lower cell group string (hereinafter, lower cell string) 45 may include the other half of the plurality of the cell groups 42 being monitored by a same voltage monitoring circuit 38 and may have voltage potential below the reference point 60.

A split rail power supply circuit 34 may define a reference point 58 and may be configured to power the voltage monitoring circuit 38. In one example, the power supply circuit 34 may power the voltage monitoring circuit 38 via the positive supply voltage pin $V_{CC}$ 46 and the negative supply voltage pin $V_{SS}$ 48 connected with a positive rail 50 and a negative rail 52 of the power supply circuit 34, respectively. The power supply circuit 34 may be, for instance, an isolated bipolar power supply including a primary side driver 54 supplying voltage magnitude $V_{DRV}$ to a primary coil of a step-up isolation transformer 56, such that a current is generated in a secondary coil of the transformer 56. The secondary coil of the transformer 56 may be a center-tapped coil sharing the reference point 58 with the reference point 60 of the plurality of the cell groups 42 being monitored by the voltage monitoring circuit 32a. The transformer 56 may be configured to generate output supply voltage $\pm V_{DRV}$, wherein magnitude of the output supply voltage $V_{DRV}$ measured with respect to the reference point 58 exceeds a maximum voltage magnitude output by each of the upper and lower cell strings 43, 45, e.g., exceeds a sum of voltage magnitudes of the cells 14 and/or cell groups 42 defining each of the cell strings 43, 45. In some examples, the secondary coil of the transformer 56 may be connected with a full-wave rectifier (shown generally) including a plurality of diodes and capacitors and configured to convert and smooth AC output of the secondary coil to DC compatible with the voltage monitoring circuit 38.

A substrate diode, such as, for example, the substrate diode 68a described in reference to FIG. 4, having the cathode 66 connected to the voltage sensing input $V_0$ 44a and the anode 64 connected to the negative supply voltage pin $V_{SS}$ 48, may prevent current flow to the negative supply voltage pin $V_{SS}$ 48. Specifically, the substrate diode between the voltage sensing input $V_0$ 44a and the negative supply voltage pin $V_{SS}$ 48 may be off for a predefined range of positive polarity voltages measured across the cell group 42a.

Additionally or alternatively, the substrate diode 68d between the voltage sensing input $V_1$ 44b and the positive supply voltage pin $V_{CC}$ 46 may further prevent current flow to the positive supply voltage pin $V_{CC}$ 46 during cell voltage polarity reversal, such as when voltage across the cell group 42a becomes negative due to water in the cell group 42a freezing. Specifically, the voltage monitoring circuit 38a being biased by the power supply circuit 34 to the magnitude and polarity of supply voltage $\pm V_{DRV}$ measured with respect to the reference point 58 may be configured to prevent the corresponding substrate diode 68d from conducting as the magnitude of voltage across the cell group 42a will be less than the magnitude of the voltage $V_{DRV}$. Stated another way, despite being negative due to, for example, a voltage polarity reversal, the magnitude of the voltage across the cell group 42a (and therefore at the anode 64 of the substrate diode 68d) will remain smaller than magnitude of the voltage $V_{DRV}$ at the positive supply voltage pin $V_{CC}$ 46. Moreover, the biasing by the power supply circuit 34 will further ensure that magnitude of voltage $V_{DRV}$ at the positive supply voltage pin $V_{CC}$ 46 is greater than the sum of voltages across the plurality of cell groups 42 above the reference point 60, thereby preventing the substrate diodes 68 of the corresponding voltage sensing inputs 44 from conducting current, i.e., becoming forward biased.

Similarly, the biasing by the power supply 34 may cause the substrate diode 68c between the voltage sensing input $V_1$ 44b and the negative supply voltage pin $V_{SS}$ 48, as described, for example, in reference to FIG. 4, to prevent current flow to the negative supply voltage pin $V_{SS}$ 48 during cell voltage polarity reversal, such as when voltage across the cell group 42a changes polarity due to water in the cell group 42a freezing. Specifically, the voltage monitoring circuit 38a being biased by the power supply circuit 34 to the magnitude and polarity of supply voltage $\pm V_{DRV}$ measured with respect to the reference point 58 may be configured to prevent the corresponding substrate diode 68b from conducting as the magnitude of voltage across the cell group 42a will be less than the magnitude of the voltage $V_{DRV}$. Stated another way, despite voltage across the cell group 42a being negative due to, for example, a voltage polarity reversal, the magnitude of the voltage at the positive supply voltage pin $V_{SS}$ 46 (and therefore at the cathode of the substrate diode 68b) will remain greater than magnitude of the voltage across the cell group 42a.

The voltage monitoring circuit 38 being biased by the power supply circuit 34 may be further configured to measure cell voltage across the cell groups 42 using one of a unipolar mode and a bipolar mode. In one example, being in the unipolar mode may enable the voltage monitoring circuit 38 to detect voltage signals having a predefined range of magnitudes and positive polarity, such as, but not limited to, voltages between 0V and 5V. In another example, being in the bipolar mode may enable the voltage monitoring circuit 38 to detect voltage signals having a predefined range of magnitudes and one of positive and negative polarities, such as, but not limited to, voltages between ±2.5V.

In one example, the voltage monitoring circuit 38 in a unipolar mode may indicate voltage magnitude across a given cell group 42 of the fuel cell stack 12 as 0V, even though polarity of voltage across the cell group 42 is negative, such as when voltage polarity reversal occurs in the one or more cell groups 42 due to water in the fuel cell groups 42 freezing. The control logic circuit 36, responsive to voltage measured across the cell group 42 in a unipolar mode being 0V, may issue a command to the voltage monitoring circuit 38 to re-measure voltage magnitude and polarity across the cell group 42 using a bipolar mode. The control logic circuit 36 may issue an alert notification in response to voltage polarity across the cell group 42 measured in a bipolar mode being negative.

Figure 6:
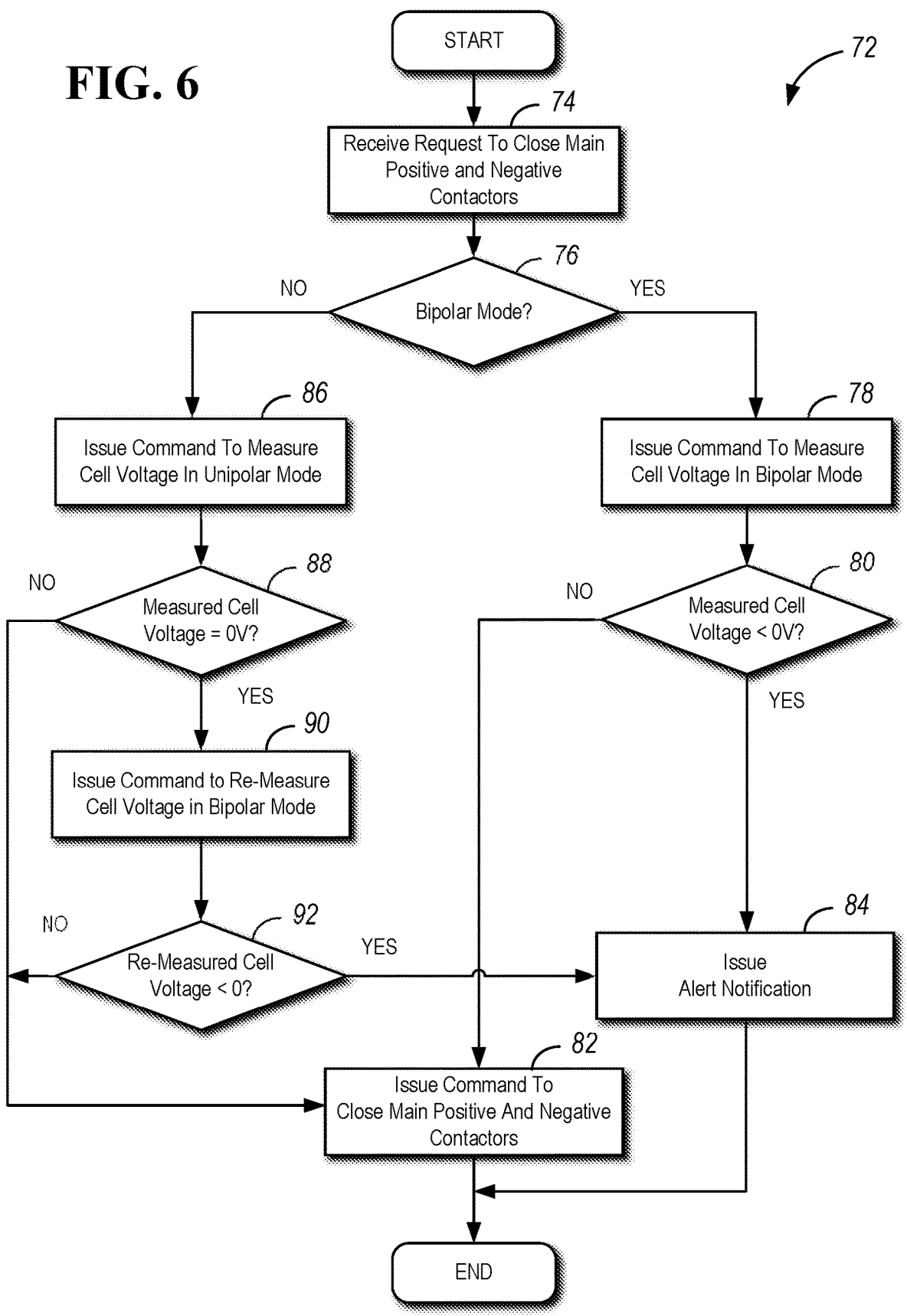
FIG. 6 is a flowchart illustrating an algorithm for monitoring cell voltage during cell voltage polarity reversal.

In reference to FIG. 6, an example process 72 for sensing voltage in the fuel cell stack 12 of the vehicle 10 is shown. In one example, the process 72 may be implemented for a voltage monitoring circuit, such as the voltage monitoring circuit 38a described in reference to FIG. 5. The process 72 may begin at block 74 where the control logic circuit 36 receives a signal indicating a request to close one or more switches 30. In one example, the control logic circuit 36 may receive a request from one or more other controllers of the vehicle 10 to close one or more of the main positive and negative contactors connecting the fuel cell stack 12 to the high voltage bus 20.

Responsive to the request, the control logic circuit 36 at block 76 determines whether the voltage monitoring circuit 38 is in a bipolar mode. In one example, in the bipolar mode the voltage monitoring circuit 38 may be configured to measure voltages having a predefined range of magnitudes in both positive and negative polarities.

Responsive to determining at block 76 that the voltage monitoring circuit 38 is in a bipolar mode, the control logic circuit 36 at block 78 issues a command to measure cell voltage across one or more cells 14 and/or cell groups 42 using the bipolar mode. The control logic circuit 36 may, in one example, issue a command to the voltage monitoring circuit 38 having a plurality of the voltage sensing inputs 44 connected to a plurality of the cell groups 42 to measure cell voltage across the cell groups 42. In some examples, the voltage monitoring circuit 38 including an N+1 number of voltage sensing inputs 44 may provide voltage measurements for an N number of cell groups 42 of the fuel cell stack 12. Furthermore, in other examples, the cell groups 42 being monitored by the voltage monitoring circuit 38 may be further divided into an upper and lower cell strings 43, 45 with respect to the reference point 60, wherein the upper cell string 43 has positive potential with respect to the reference point 60, e.g., measured above the reference point 60, and the lower cell string 45 has a negative potential with respect to the reference point 60, e.g., measured below the reference point 60.

At block 80 the control logic circuit 36 determines whether voltages measured across the cell groups 42 are less than 0V, i.e., voltage values have negative polarities. Responsive to voltages measured across the cell groups 42 being equal to or greater than 0V, at block 82 the control logic circuit 36 issues one or more commands to close the main positive and negative contactors 30a, 30b.

At block 84 the control logic circuit 36 issues an alert notification responsive to voltages measured across at least one of the cell groups 42 being less than 0V. In one example, the power supply circuit 34, that supplies power to the voltage monitoring circuit 38 and that shares the reference point 58 with the reference point 60 of the cells 14 being monitored, may prevent the substrate diode 68 in one or more voltage sensing inputs 44 of the monitoring circuit 38, e.g., the substrate diode 68b between the voltage sensing input $V_1$ 44b and the positive supply voltage pin $V_{CC}$ 46, from becoming forward biased and prevent a flow of current to the supply pin during cell voltage polarity reversal. Stated another way, the power supply circuit 34 biasing prevents one or more substrate diodes 68 from conducting and enables the voltage monitoring circuit 38 to detect and report a voltage value having a negative polarity.

Responsive to determining at block 76 that the voltage monitoring circuit 38 is not in the bipolar mode, the control logic circuit 36 at block 86 issues a command to measure cell voltage across one or more cells 14 and/or cell groups 42 using a unipolar mode. In one example, being in the unipolar mode may enable the voltage monitoring circuit 38 to detect voltage signals having a predefined range of magnitudes and positive polarity.

At block 88 the control logic circuit 36 determines whether one or more measured cell voltages is equal 0V. In one example, the voltage monitoring circuit 38 in a unipolar mode may indicate voltage magnitude across a given cell group 42 of the fuel cell stack 12 as 0V, even though polarity of voltage across the cell group 42 is negative, such as when voltage polarity reversal occurs in the one or more cell groups 42 due to water in the fuel cell groups 42 freezing. Responsive to the magnitude of voltage across the cell groups 42 being greater than 0V, the control logic circuit 36 at block 82 issues a command to close the switches 30. In one example, the control logic circuit 36 may command to close one or more of the main positive and negative contactors connecting the fuel cell stack 12 to the high voltage bus 20.

Responsive to magnitudes of voltages across one or more cell groups 42 being 0V, the control logic circuit 36 at block 90 issues a command to the voltage monitoring circuit 38 to re-measure voltage across the cell groups 42 using a bipolar mode. At block 92 the control logic circuit 36 determines whether voltages measured across the cell groups 42 are less than 0V, i.e., voltage values have negative polarities. Responsive to voltages measured across the cell groups 42 being equal to or greater than 0V, at block 82 the control logic circuit 36 issues one or more commands to close the switches 30.

At block 84 the control logic circuit 36 issues an alert notification responsive to detecting at block 92 that voltages measured across one or more cell groups 42 are less than 0V, i.e., have negative polarity. In one example, the power supply circuit 34 biasing the supply voltage of the voltage sensing inputs 44 may prevent the substrate diode 68b between the voltage sensing input $V_1$ 44b and the positive supply voltage pin $V_{CC}$ 46 from becoming forward biased, thereby preventing a flow of current to the supply pin during cell voltage polarity reversal. Stated another way, the power supply circuit 34 biasing prevents the substrate diode 68 from conducting and enables measuring of negative voltage across the cell group 42. The process 72 may then end. In some examples, the process 72 may be repeated in response to receiving a signal indicative of a request to close the switches 30 or in response to another signal or request.

The processes, methods, or algorithms disclosed herein may be deliverable to or implemented by a processing device, controller, or computer, which may include any existing programmable electronic control unit or dedicated electronic control unit. Similarly, the processes, methods, or algorithms may be stored as data and instructions executable by a controller or computer in many forms including, but not limited to, information permanently stored on non-writable storage media such as ROM devices and information alterably stored on writeable storage media such as floppy disks, magnetic tapes, CDs, RAM devices, and other magnetic and optical media. The processes, methods, or algorithms may also be implemented in a software executable object. Alternatively, the processes, methods, or algorithms may be embodied in whole or in part using suitable hardware components, such as Application Specific Integrated Circuits (ASICs), Field-Programmable Gate Arrays (FPGAs), state machines, controllers or other hardware components or devices, or a combination of hardware, software and firmware components.

The words used in the specification are words of description rather than limitation, and it is understood that various changes may be made without departing from the spirit and scope of the disclosure. As previously described, the features of various embodiments may be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics may be compromised to achieve desired overall system attributes, which depend on the specific application and implementation. These attributes may include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and may be desirable for particular applications.

What is claimed is:

1. A vehicle system comprising:
   a voltage sensing circuit configured to detect voltages across cells in a fuel cell stack, and powered by a power supply sharing a voltage reference with the cells and having a voltage magnitude greater than a sum of voltage magnitudes of the cells, the voltage sensing circuit including a first plurality of substrate diodes configured to prevent current flow through the sensing circuit responsive to polarity being positive, and a second plurality of substrate diodes configured to prevent current flow through the sensing circuit responsive to the polarity being negative; and
   a controller configured to, responsive to a change in the polarity in at least one of the voltages indicative of freezing of the cells, issue an alert notification.

2. The system of claim 1, wherein the second plurality of substrate diodes are diodes having a first terminal connected to one of positive and negative supply voltage pins of the sensing circuit and a second terminal connected to one of positive and negative terminals of the cells.

3. The system of claim 1, wherein a first string of the cells is arranged to have a positive polarity with respect to the voltage reference and a second string of the cells is arranged to have a negative polarity with respect to the voltage reference, and wherein the voltage magnitude of the power supply with respect to the voltage reference is greater than a sum of voltage magnitudes of the cells in each of the strings.

4. The system of claim 1, wherein the change in polarity is detected responsive to a voltage magnitude detected immediately prior to being zero volts.

5. The system of claim 1, further comprising at least one resistor connected between the cells and the circuit such that magnitude of current flowing to the circuit is below a predefined threshold.

6. The system of claim 5, wherein the predefined threshold is defined by an operating range of the circuit.

7. A method for a vehicle comprising:
   issuing an alert notification, by a controller, responsive to a change in polarity in at least one voltage detected by a voltage sensing circuit across cells in a fuel cell stack that is indicative of freezing of the cells, the sensing circuit being powered by a power supply sharing a voltage reference with the cells and having a voltage magnitude greater than a sum of voltage magnitudes of the cells, wherein the sensing circuit includes a first plurality of substrate diodes configured to prevent currently flow through the sensing circuit responsive to the polarity being positive and a second plurality of substrate diodes configured to prevent current flow through the sensing circuit responsive to the polarity being negative.

8. The method of claim 7, wherein a first string of the cells is arranged to have a positive polarity with respect to the voltage reference and a second string of the cells is arranged to have a negative polarity with respect to the voltage reference, and wherein the voltage magnitude of the power supply with respect to the voltage reference is greater than a sum of voltage magnitudes of the cells in each of the strings.

9. The method of claim 7, wherein the change in polarity is detected responsive to a voltage magnitude detected immediately prior to being zero volts.

10. The method of claim 7, further comprising at least one resistor connected between the cells and the circuit such that magnitude of current flowing to the circuit is below a predefined threshold.

11. The method of claim 10, wherein the predefined threshold is defined by an operating range of the circuit.

* * * * *